(12) United States Patent
Wu et al.

(10) Patent No.: US 6,902,942 B2
(45) Date of Patent: Jun. 7, 2005

(54) DEVICE AND METHOD FOR DETECTING ALIGNMENT OF DEEP TRENCH CAPACITORS AND WORD LINES IN DRAM DEVICES

(75) Inventors: Tie Jiang Wu, Ilan (TW); Chien-Chang Huang, Banchiau (TW); Bo Ching Jiang, Hualien (TW); Yu-Wei Ting, Taipei (TW); Chin-Ling Huang, Shulin (TW)

(73) Assignee: Nanya Technology Corporation, Taoyuan (TW)

( * ) Notice: Subject to any disclaimer, the term of this patent is extended or adjusted under 35 U.S.C. 154(b) by 41 days.

(21) Appl. No.: 10/613,175

(22) Filed: Jul. 3, 2003

(65) Prior Publication Data

US 2004/0069989 A1 Apr. 15, 2004

(30) Foreign Application Priority Data

Oct. 9, 2002 (TW) ........................................ 91123324 A

(51) Int. Cl.[7] .............................................. H01L 21/66
(52) U.S. Cl. .......................... 438/18; 438/386; 438/462; 257/48; 257/302; 324/71.5
(58) Field of Search ........................... 438/17, 18, 243, 438/386, 462; 257/48, 301, 302, 532; 324/71.5

(56) References Cited

U.S. PATENT DOCUMENTS

| | | | | | |
|---|---|---|---|---|---|
| 4,914,739 | A | * | 4/1990 | Malhi ......................... | 257/302 |
| 6,291,835 | B1 | * | 9/2001 | Tsuji et al. .................... | 257/48 |
| 6,339,228 | B1 | * | 1/2002 | Iyer et al. ..................... | 257/48 |
| 2004/0031960 | A1 | * | 2/2004 | Wu et al. ...................... | 257/48 |

* cited by examiner

Primary Examiner—Stephen W. Smoot
(74) Attorney, Agent, or Firm—Quintero Law Office

(57) ABSTRACT

A test device and method for detecting alignment of word lines and deep trench capacitors in DRAM devices with vertical transistors. In the test device, an active area is disposed in the scribe line region. An H-type deep trench capacitor is disposed in the active area, and has parallel first and second portions and a third portion. Each of the first and second portions has a center and two ends. The third portion is disposed between the centers of the first and second portions. First to fourth conductive pads are disposed on the two ends of the first and second portions respectively. A bar-type conductive pad is disposed between the first and second portions, having a center aligned with a center of the third portion.

12 Claims, 3 Drawing Sheets

DEVICE AND METHOD FOR DETECTING ALIGNMENT OF DEEP TRENCH CAPACITORS AND WORD LINES IN DRAM DEVICES

BACKGROUND OF THE INVENTION

1. Field of the Invention

The present invention relates to test devices, and more particularly, to a test device for detecting alignment of deep trench capacitors and word lines in DRAM devices with vertical transistors, as well as a test method thereof.

2. Description of the Related Art

With the wide application of integrated circuits (ICs), several kinds of semiconductor devices with higher efficiency and lower cost are presently produced based on different objectives, making DRAM an important semiconductor device in the information and electronics industry.

Most DRAM carries one transistor and one capacitor in a single DRAM cell. The memory capacity of the DRAM can reach 256 megabits. Therefore, with increased integration it is necessary to reduce the size of memory cells and transistors to accommodate DRAM with higher memory capacity and processing speed. A 3-D capacitor structure can itself reduce occupation area in the semiconductor substrate, such as with a deep trench capacitor, and is applied to the fabrication of the DRAM of 64 megabits and above.

As compared with a traditional plane transistor, however, this structure covers many areas of the semiconductor substrate and cannot satisfy the demands of high integration. Therefore, a vertical transistor which can save space is important in structuring memory unit.

FIG. 1 is a cross section of a conventional memory device with vertical transistors, and FIG. 2 is a layout of the conventional memory device as shown in FIG. 1. The adjacent memory cells may experience current leakage and cell failure, reducing process yield, if word line masks and deep trench capacitors are not aligned accurately. Therefore, process yield and reliability of the memory cells can be improved if alignment accuracy between the masks of word lines and the deep trench capacitors is controlled within an acceptable range.

SUMMARY OF THE INVENTION

It is therefore an object of the present invention to detect alignment of word lines and deep trench capacitors in DRAM devices.

According to the above mentioned object, the present invention provides a test device and method for detecting alignment of word lines and deep trench capacitors in DRAM devices with vertical transistors.

In the test device of the present invention, an active area is disposed in the scribe line region. An H-type deep trench capacitor is disposed in the active area, and has parallel first and second portions and a third portion. Each first and second portion has a center and two ends. The third portion is disposed between the centers of the first and second portions. First to fourth conductive pads are disposed on the two ends of the first and second portions respectively. A bar-type conductive pad is disposed between the first and second portions, having a center aligned with a center of the third portion.

According to the present invention, a method for detecting alignment of deep trench capacitors and word lines in DRAM devices with vertical transistors includes the following steps. First, a wafer with at least one scribe line region and at least one memory region is provided. Then, a plurality of memory cells in the memory region and at least one test device in the scribe line region are formed simultaneously, wherein the memory cells have word lines and deep trench capacitors. A first resistance between the first conductive pad disposed on the first portion and the bar-type conductive pad is detected. A second resistance between the second conductive pad disposed on the second portion and the bar-type conductive pad is detected. Next, alignment of the H-type deep trench capacitor and the bar-type conductive pad is determined according to the first resistance and the second resistance. Finally, alignment of the deep trench capacitors and word lines in the memory regions is determined according to alignment of the H-type deep trench capacitor and the bar-type conductive pad of the test device.

BRIEF DESCRIPTION OF THE DRAWINGS

The present invention can be more fully understood by the subsequent detailed description and examples with reference made to the accompanying drawings, wherein.

DETAILED DESCRIPTION OF THE INVENTION

In the present invention, at least one test device 200 is formed in the scribe line region, while a plurality of memory cells with vertical transistors is formed in the memory regions on a wafer simultaneously. The test device 200 is shown in FIG. 3a, and a plurality of memory cells formed in the memory region is shown in FIG. 1 and FIG. 2.

Figure 1:
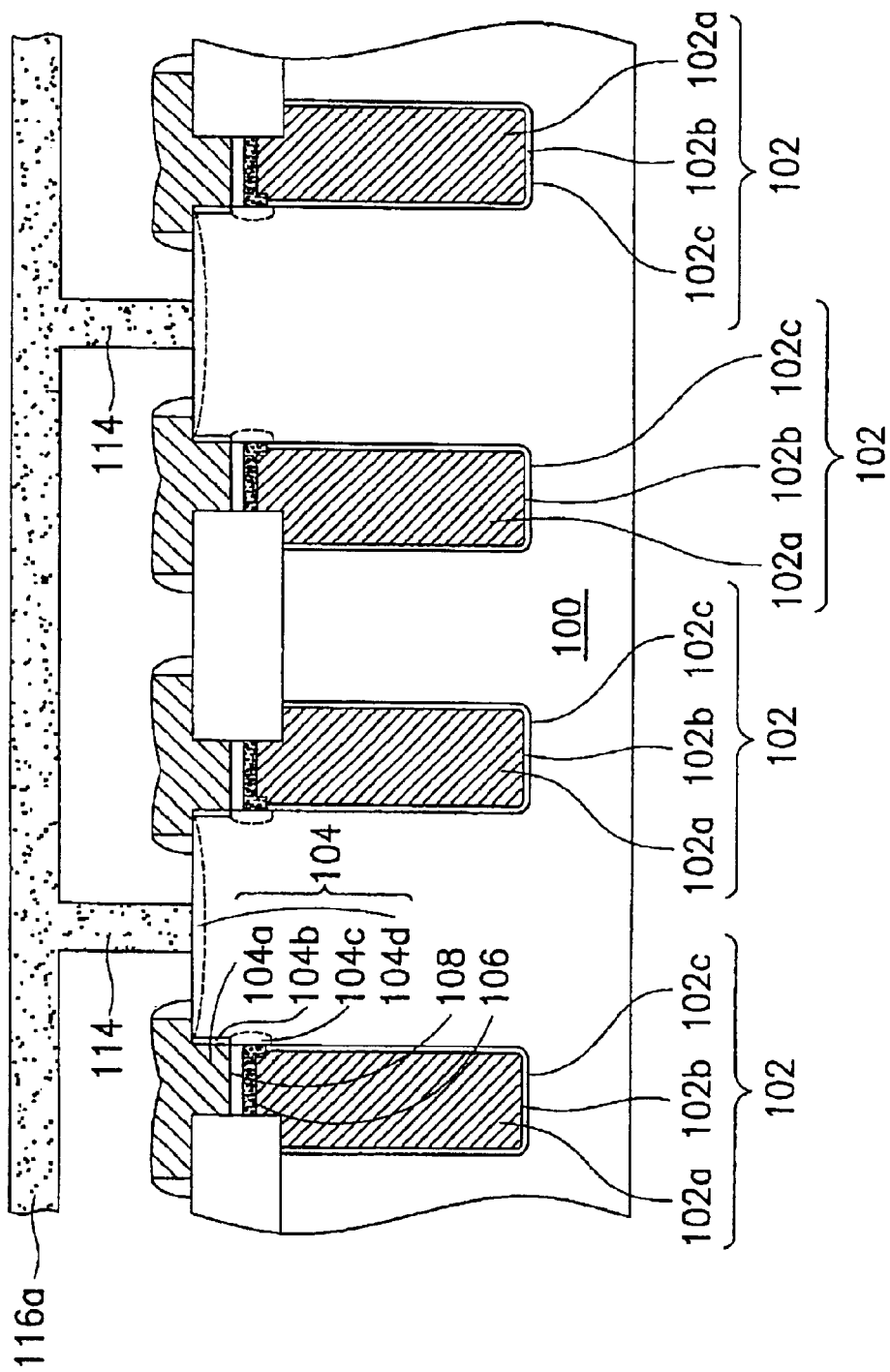
FIG. 1 is a cross section of a conventional memory device with vertical transistors.

As shown in FIG. 1, deep trench capacitors 102 are formed into a matrix and disposed in the substrate 100. Each deep trench capacitor 102 includes a top electrode 102a, an isolation layer 102b, and a storage electrode 102c, and has a vertical transistor 104 disposed thereon. Each vertical transistor 104 includes a gate 104a, a gate oxide layer 104b, a source 104c and a common drain 104d. The gate oxide layer 104b is the sidewall at the bottom of the gate 104a, and the vertical region between the source 104c and the common drain 104d in the substrate 100 is the channel of the transistor 104. In addition, an isolation layer 108 and an ion diffusion layer 106 are disposed between the gate 104a and the top electrode 102a of the deep trench capacitor 102. The sidewall of the isolation layer 108 is the source 104c, and the isolation layer 108 is disposed between the gate 104a and the ion diffusion layer 106 for electrical insulation.

Figure 2:
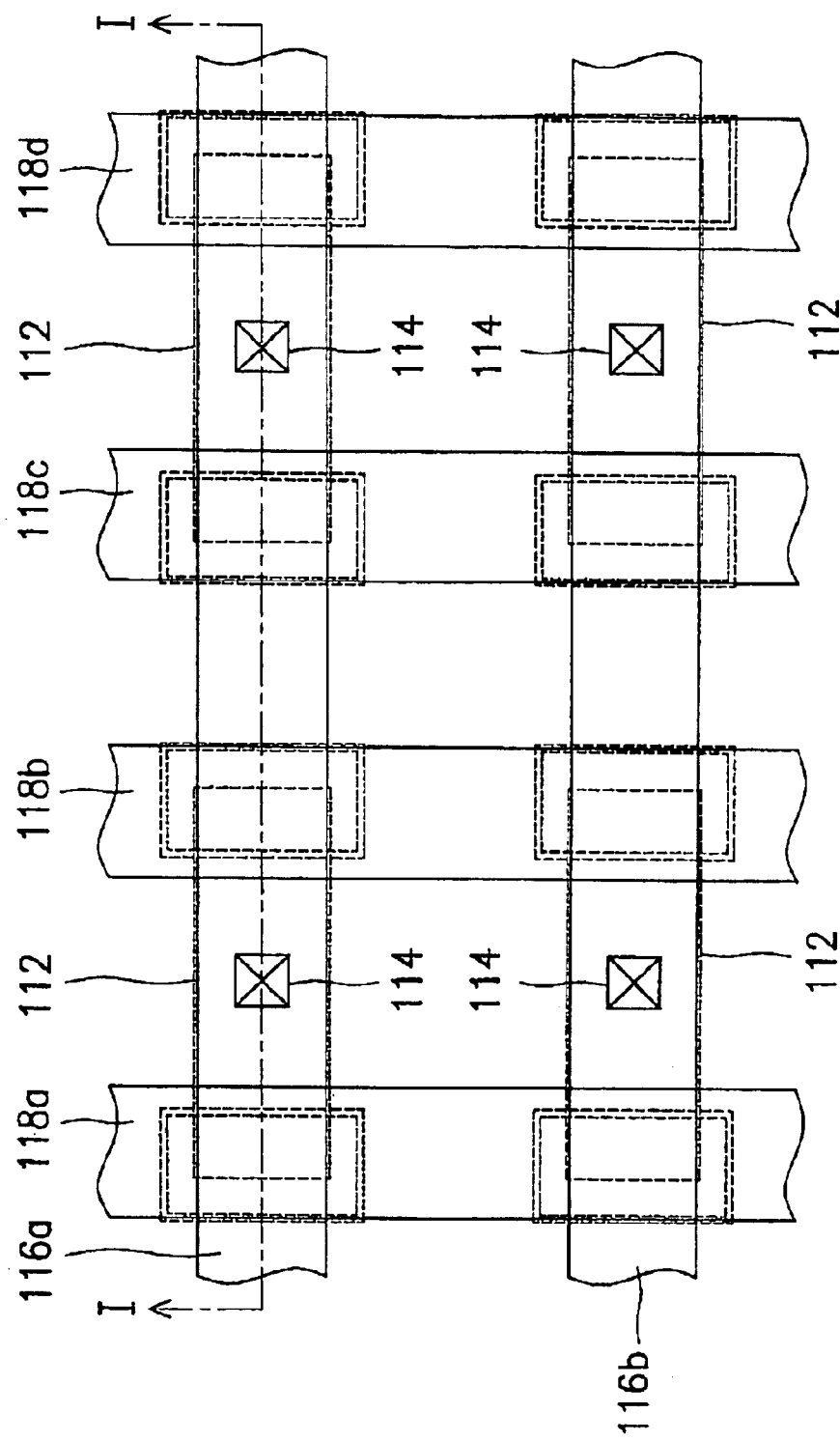
FIG. 2 is a layout of the conventional memory device as shown in FIG. 1.

As shown in FIG. 2, word lines 118a, 118b, 118c and 118d are disposed above the active area 112 as the gate 104a of the transistor 104. Command drains 104d are disposed above the active areas 112 between adjacent word lines 118a and 118b or 118c and 118d. Bit lines 116a and 116b are perpendicular to word lines 118a~118d, and are electrically coupled to the command drains through bit line contacts 114.

Figure 3A:
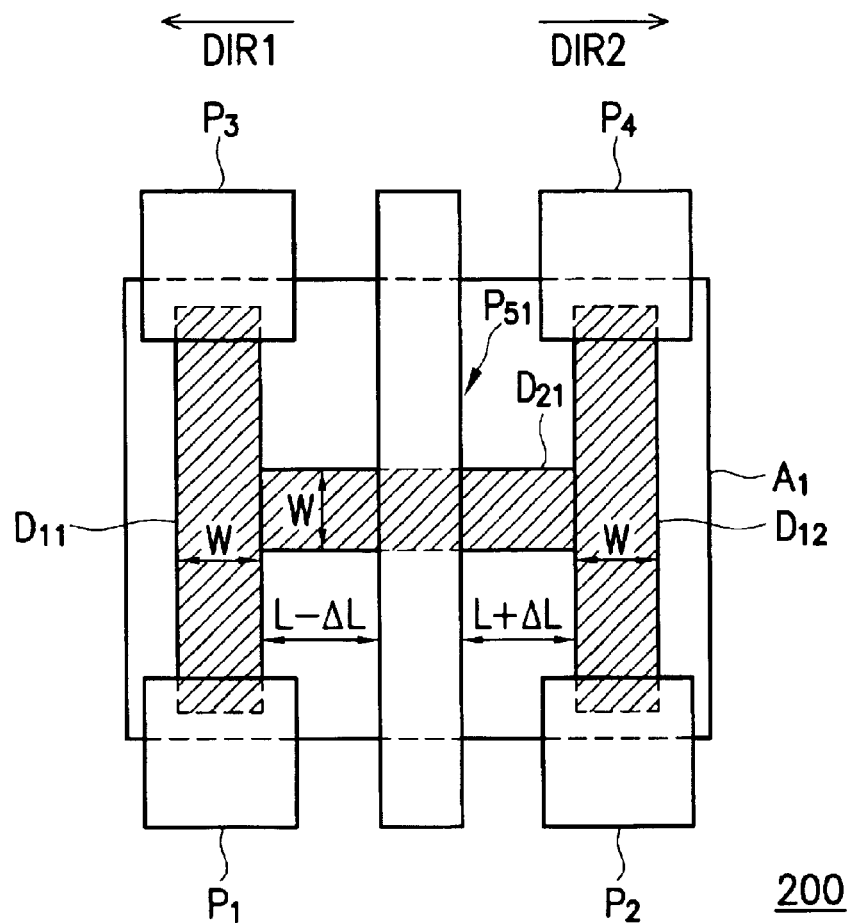
FIG. 3a is a layout of the test device according to the present invention.

FIG. 3a is a layout of the test device of the present invention. The test device 200 detects the alignment of word lines and deep trench capacitors in DRAM devices with vertical transistors, wherein the test device 200 is disposed in a scribe line region of a wafer (not shown).

In test device 200 shown in FIG. 3, an active area $A_1$ is disposed in the scribe line region (not shown) and an H-type deep trench capacitor ($D_{11}$, $D_{12}$ and $D_{21}$) is disposed in the active area. The H-type has parallel first and second portions ($D_{11}$ and $D_{12}$) and a third portion ($D_{21}$), wherein each of the first and second portions ($D_{11}$ and $D_{12}$) has a center and two ends, and the third portion $D_{21}$ is disposed between the centers of the first and second portions ($D_{11}$ and $D_{12}$). First to fourth conductive pads ($P_1$~$P_4$) are disposed on the two ends of the first and second portions ($D_{11}$ and $D_{12}$) respectively. A bar-type conductive pad $P_{51}$ is disposed between the first and second portions ($D_{11}$ and $D_{12}$), and has a center aligned with a center of the third portion D21.

In the present invention, active areas 112 in the memory region and an active area $A_1$ in the scribe line region are formed simultaneously with the same process and conditions.

The deep trench capacitors 102 of the memory cells in the memory region and an H-type deep trench capacitor ($D_{11}$, $D_{12}$ and $D_{21}$) in the active area $A_1$ are formed simultaneously with the same masks, process and conditions. The H-type deep trench capacitor has a first portion $D_{11}$, a second portion $D_{12}$ and a third portion $D_{21}$. The first and second portions $D_{11}$ and $D_{12}$ are parallel, and the third portion $D_{21}$ is disposed between the centers of the first and second portions $D_{11}$ and $D_{12}$. The first, second and third portions $D_{11}$, $D_{12}$ and $D_{21}$ all have the same width W.

The word lines 118a~118b (as the gates of the vertical transistors 104) of the memory cells in the memory regions and the first to fourth conductive pads $P_1$~$P_4$ and the bar-type conductive pad $P_{51}$ are formed simultaneously with the same masks, process and conditions. The first and third conductive pads $P_1$ and $P_3$ are disposed on the two ends of the first portions $D_{11}$ respectively. The second and fourth conductive pads $P_2$ and $P_4$ are disposed on the two ends of the second portions $D_{12}$ respectively. The bar-type conductive pad $P_{51}$ is disposed between the first and second portions ($D_{11}$ and $D_{12}$), and has a center aligned with a center of the third portion $D_{21}$. The bar-type conductive pad $P_{51}$ is parallel to the first and second potions $D_{11}$ and $D_{12}$, and perpendicular to the third portion $D_{21}$. The bar-type conductive pad $P_{51}$ is the distances L−ΔL and L+ΔL from the first portion $D_{11}$ and the second portion $D_{12}$ respectively. The first to fourth conductive pads and the bar-type conductive pad are made of the same material, such as polysilicon.

Figure 3B:
FIG. 3b is an equivalent diagram of the test device according to the present invention.

FIG. 3b is an equivalent diagram of the test device according to the present invention. Normally, a first resistance $R_1$ between the first conductive pad $P_1$ and the bar-type conductive pad $P_{51}$ can be detected. A second resistance between the first conductive pad $P_2$ and the bar-type conductive pad $P_{51}$ can be detected. The first resistance $R_1$ and the second resistance $R_2$ can be obtained according to equations 1 and 2.

$$R_1 = R_{DT} \times \frac{L - \Delta L}{W}; \quad (1)$$

$$R_2 = R_{DT} \times \frac{L + \Delta L}{W}; \quad (2)$$

Wherein $R_{DT}$ is the resistance per surface area of the H-type deep trench capacitor ($D_{11}$, $D_{12}$ and $D_{21}$), W is the width of the first portion $D_{11}$, the second portion $D_{12}$ and the third portion $D_{21}$, L−ΔL is the distance between the bar-type conductive pad $P_{51}$ and the first portion $D_{11}$, and L+ΔL is the distance between the bar-type conductive pad $P_{51}$ and the second portion $D_{12}$. Use of the same process, material and conditions, equations 3 and 4 can be achieved according to the equations 1 and 2.

$$\frac{R_1}{R_2} = \frac{L - \Delta L}{L + \Delta L}; \quad (3)$$

$$\Delta L = L \times \frac{R_2 - R_1}{R_2 + R_1}; \quad (4)$$

Thus, the alignment shift AL between the bar-type conductive pad $P_{51}$ and the first and second portions ($D_{11}$ and $D_{12}$) can be obtained if the first resistance $R_1$ and the second resistance $R_2$ are measured. That is to say, alignment shift ΔL between the bar-type conductive $P_{51}$ and the first and second portions ($D_{11}$ and $D_{12}$) of the H-type deep trench capacitor is zero when the first resistance $R_1$ equals the second resistance $R_2$.

With reference to FIG. 3, the bar-type conductive pad $P_{51}$ is shifted by a distance ΔL along the direction DIR1 if the masks of the H-type deep trench capacitor ($D_{11}$, $D_{12}$ and $D_{21}$) and the bar-type conductive pad $P_{51}$ have an alignment shift ΔL in the direction DIR1. If this condition is met, the first resistance $R_1$ is smaller than the second resistance $R_2$ according to the equations 1 and 2. Moreover, the alignment shift ΔL can be obtained according to the equation 4.

On the contrary, the bar-type conductive pad $P_{51}$ is shifted by a distance ΔL along the direction DIR2 if the masks of the H-type deep trench capacitor ($D_{11}$, $D_{12}$ and $D_{21}$) and the bar-type conductive pad $P_{51}$ have an alignment shift ΔL in the direction DIR2. If this condition is met, the first resistance $R_1$ is larger than the second resistance $R_2$ according to the equations 1 and 2. Moreover, the alignment shift can be obtained according to the equation 4.

In the present invention, the test device 200 disposed in the scribe line region and a plurality of memory cells with vertical transistors in the memory region are formed simultaneously. For example, the deep trench capacitors 102 of the memory cells in the memory region and the H-type deep trench capacitor ($D_{11}$, $D_{12}$ and $D_{21}$) in the active area $A_1$ are formed simultaneously with the same masks, process and conditions. The word lines 118a~118b of the memory cells in the memory region and the first to fourth conductive pads $P_1$~$P_4$ and the bar-type conductive pad $P_{51}$ are formed simultaneously with the same mask, process and conditions. Therefore, the memory region and the test device may have the same alignment shift between deep trench capacitors (102, $D_{11}$ and $D_{12}$) and word lines (118a~118d, $P_1$~$P_4$ and $P_{51}$) use of the same mask and the same process. Thus, alignment of deep trench capacitors and word lines in memory region can be obtained according to whether the first resistance $R_1$ equals the second resistance $R_2$.

The present invention also provides a method for detecting alignment of deep trench capacitors and word lines in memory devices with vertical transistors. In the method of the present invention, a wafer with at least one scribe line region and at least one memory region is provided.

A plurality of memory cells with vertical transistors in the memory region and at least one test device in the scribe line region are formed simultaneously, wherein the memory regions have deep trench capacitors and word lines as shown in FIG. 1 and FIG. 2. The structure of the test device 200 is shown in FIG. 3. The deep trench capacitors 102 in the memory regions and the H-type deep trench capacitor ($D_{11}$, $D_{12}$ and $D_{21}$) in the test device are formed by the same mask and the same process. The word line 118a~118d in the memory regions and the first to fourth conductive pads ($P_1$~$P_4$) and the bar-type conductive pad $P_{51}$ are formed by the same mask and the same process.

Next, a first resistance $R_1$ between the first conductive pad $P_1$ and the bar-type conductive pad $P_{51}$ is determined. A second resistance $R_2$ between the second conductive pad $P_2$ and the bar-type conductive pad $P_{51}$ is determined. Then, alignment of the H-type deep trench capacitor and the bar-type conductive pad $P_{51}$ of the test device 200 is determined according to whether the first resistance $R_1$ is equal to the second resistance $R_2$.

The memory region and the test device may have the same alignment shift between deep trench capacitors (102, $D_{11}$ and $D_{12}$) and word lines (118a~118d, $P_1$~$P_4$ and $P_{51}$) use of the same masks and the same process. Thus, alignment of deep trench capacitors and word lines in memory region can be obtained according to whether the first resistance $R_1$ equals the second resistance $R_2$. The alignment shift between deep trench capacitors and word lines in the memory regions can also be obtained according to the equation 4.

Further, in the present invention the test device is disposed in the scribe line region to avoid occupying layout space.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A test device for detecting alignment of deep trench capacitors and word lines in DRAM devices with vertical transistors, wherein the test device is disposed in a scribe line region of a wafer, comprising:

an active area disposed in the scribe line region;

an H-type deep trench capacitor disposed in the active area, having parallel first and second portions and a third portion, wherein each of the first and second portions has a center and two ends, and the third portion is disposed between the centers of the first and second portions;

first to fourth conductive pads disposed on the two ends of the first and second portions respectively; and a bar-type conductive pad disposed between the first and second portions, having a center aligned with a center of the third portion.

2. The test device as claimed in claim 1, wherein the first to fourth conductive pads and the bar-type conductive pad are made of the same material.

3. The test device as claimed in claim 1, wherein the first to fourth conductive pads and the bar-type conductive pad are made of polysilicon.

4. The test device as claimed in claim 1, wherein the bar-type conductive pad, the first portion and the second portion are parallel.

5. A method for detecting alignment of deep trench capacitors and word lines in DRAM devices with vertical transistors, comprising:

providing a wafer with at least one scribe line region and at least one memory region;

forming a plurality of memory cells with vertical transistors in the memory region and at least one test device in the scribe line region simultaneously, wherein the memory cells have word line areas and deep trench capacitors, the test device including:

an active area disposed in the scribe line region;

an H-type deep trench capacitor disposed in the active area, having parallel first and second portions and a third portion, wherein each of the first and second portions has a center and two ends, and the third portion is disposed between the centers of the first and second portions;

first to fourth conductive pads disposed on the two ends of the first and second portions respectively; and a bar-type conductive pad disposed between the first and second portions, having a center aligned with a center of the third portion;

detecting a first resistance between the first conductive pad disposed on the first portion and the bar-type conductive pad, and a second resistance between the second conductive pad disposed on the second portion and the bar-type conductive pad;

determining alignment of the H-type deep trench capacitor and the bar-type conductive pad according to the first resistance and the second resistance; and determining alignment of the deep trench capacitors and word lines in the memory region according to alignment of the H-type deep trench capacitor and the bar-type conductive pad of the test device.

6. The method as claimed in claim 5, wherein the bar-type conductive pad is a predetermined distance from the first and second portions.

7. The method as claimed in claim 6, further comprising a step of determining alignment shift ($\Delta L$) of the H-type deep trench capacitor and the bar-type conductive pad according to the first resistance, the second resistance, and the predetermined distance between first and second portions and the bar-type conductive pad respectively.

8. The method as claimed in claim 7, wherein the alignment shift ($\Delta L$) is determined by an equation:

$$\Delta L = L \times \frac{(R2 - R1)}{(R2 + R1)};$$

wherein L is the predetermined distance between first and second portions and the bar-type conductive pad respectively; R1 is the first resistance between the first conductive pad disposed on the first portion and the bar-type conductive pad; and R2 is the second resistance between the second conductive pad disposed on the second portion and the bar-type conductive pad.

9. The method as claimed in claim 5, wherein the first to fourth conductive pads and the bar-type conductive pad are made by the same material.

10. The method as claimed in claim 5, wherein the first to fourth conductive pads and the bar-type conductive pad are made of polysilicon.

11. The method as claimed in claim 5, wherein the bar-type conductive pad, the first portion and the second portion are parallel.

12. The method as claimed in claim 5, wherein the alignment of the H-type trench capacitor and the bar-type conductive pad is abnormal when the first resistance does not equal the second resistance.

* * * * *